United States Patent
Takeguchi et al.

(10) Patent No.: US 8,846,186 B2
(45) Date of Patent: Sep. 30, 2014

(54) LAYERED PRODUCT FOR METAMATERIAL TRANSFER AND METAMATERIAL TRANSFERRED SUBSTRATE

(75) Inventors: Keigo Takeguchi, Tokyo (JP); Masanori Tsuruta, Tokyo (JP); Jun Koike, Tokyo (JP)

(73) Assignee: Asahi Kasei Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 13/610,360

(22) Filed: Sep. 11, 2012

(65) Prior Publication Data
US 2013/0101815 A1   Apr. 25, 2013

(30) Foreign Application Priority Data

Sep. 13, 2011 (JP) ................................ 2011-199503
Dec. 15, 2011 (JP) ................................ 2011-274103

(51) Int. Cl.
*B32B 3/08* (2006.01)
(52) U.S. Cl.
USPC ...................... 428/209; 428/195.1; 249/114.1
(58) Field of Classification Search
USPC .............................. 428/209, 195.1; 249/114.1
See application file for complete search history.

(56) References Cited

U.S. PATENT DOCUMENTS

2012/0205343 A1* 8/2012 Koike et al. ..................... 216/52
2013/0049255 A1* 2/2013 Matsumoto et al. .......... 264/220
2013/0123092 A1* 5/2013 Miyasaka et al. ............... 501/53

FOREIGN PATENT DOCUMENTS

JP          2013-144429       *  7/2013

OTHER PUBLICATIONS

Chanda et al., Nature Nanotechnology, vol. 6, No. 7, pp. 402-407 (2011).*
Enkrich et al., Advanced Materials, vol. 17, pp. 2547-2549 (2005).*

* cited by examiner

*Primary Examiner* — Peter D. Mulcahy
*Assistant Examiner* — Henry Hu
(74) *Attorney, Agent, or Firm* — Birch, Stewart, Kolasch & Birch, LLP

(57) ABSTRACT

Disclosed is a layered product for metamaterial transfer for transferring a metamaterial layer onto a substrate, including: a resin mold having a fine convex-concave structure on a surface; and an inorganic layer as a metamaterial layer including at least one dielectric layer and at least one metal layer deposited on a surface of the resin mold, wherein resin of the resin mold contains fluorine, and a ratio between an average elemental fluorine concentration Eb of the resin and an elemental fluorine concentration Es of the surface of the resin mold satisfies the following equation: $200 \geq Es/Eb \geq 5.0$.

7 Claims, 6 Drawing Sheets

LAYERED PRODUCT FOR METAMATERIAL TRANSFER AND METAMATERIAL TRANSFERRED SUBSTRATE

TECHNICAL FIELD

The present invention relates to a layered product for transferring an inorganic layer onto a substrate, and more particularly, to a layered product for metamaterial transfer capable of transferring a metamaterial layer onto a substrate and a metamaterial transferred substrate manufactured using the layered product for transfer.

BACKGROUND ART

In recent years, metamaterials attract attention in the art. The metamaterial is an artificial material capable of realizing physical properties that may not be found in nature by combining significantly small elements (structures) relative to the wavelengths of electromagnetic waves. By using the metamaterial, it is possible to obtain a material (left-handed material) having both negative electric permittivity and negative magnetic permeability and also having a negative refractive index. In the left-handed material, an energy propagation direction and a wave propagation direction are reversed, and as a result, the Doppler effect or the Cerenkov effect also reversely occurs. Meanwhile, since the refractive index can be negative, a perfect lens capable of exceeding a refraction limitation or a super lens capable of obtaining a sub-wavelength resolution by enhancing a near-field has been proposed. In addition, cloaking, MRI electromagnetic wires, perfect absorbers, and the like have been proposed using such a metamaterial characteristic.

The characteristic of the metamaterial is noticeably influenced by a material and a structure. In particularly, it is necessary to sufficiently reduce a size of the structure relative to a wavelength of the electromagnetic wave. For this reason, techniques of manufacturing the metamaterial using a nanofabrication technique such as FIB (focused ion beam) fabrication have been proposed (refer to Non-patent Literature 1). Furthermore, a metamaterial based on a fishnet structure made of Ag and magnesium fluoride has been proposed (refer to Non-patent Literature 2).

CITATION LIST

Non-Patent Literatures

[Non-patent Literature 1] Adv. Mater. 2005, 17, 2547-2549
[Non-patent Literature 2] Nature Nanotechnology, Vol. 6, No. 7, 402-407

SUMMARY OF THE INVENTION

Technical Problem

However, in the technique of Non-Patent Literature 1, a metamaterial having only a micrometer-order area is inevitably obtained due to a principle of nanofabrication.

The present invention has been made in view of the aforementioned problems, and an aim thereof is to provide a layered product for metamaterial transfer capable of easily transferring a large-area metamaterial layer onto a substrate as a metamaterial formation target and a metamaterial transferred substrate obtained by transferring the metamaterial layer onto the substrate.

Solution to Problem

According to an aspect of the present invention, there is provided a layered product for metamaterial transfer for transferring a metamaterial layer onto a substrate, including: a resin mold having a fine convex-concave structure on its surface; and the metamaterial layer including at least one dielectric layer and at least one metal layer formed on the surface of the resin mold, wherein resin of the resin mold contains fluorine, and a ratio between an average elemental fluorine concentration $Eb$ of the resin and an elemental fluorine concentration $Es$ of a surface portion of the resin mold satisfies the following equation (1):

$$200 \geq Es/Eb \geq 5.0 \tag{1}$$

It is characterized that a metamaterial transferred substrate according to the present invention is obtained by transferring the metamaterial layer onto the substrate from the layered product for metamaterial transfer according to the present invention.

According to another aspect of the present invention, there is provided a layered product for metamaterial transfer, including: a resin mold having a convex-concave structure on its surface; and an inorganic layer having a layered structure including at least one metal layer, at least one dielectric layer, and at least one metal layer provided on the convex-concave structure of the resin mold, wherein a distance $lcv$ between a top position $S$ of a convex portion of the convex-concave structure and a top position $Scv$ of the inorganic layer formed over the convex portion of the convex-concave structure satisfies the following equation (2):

$$0 < lcv \leq 1.0ho \tag{2}$$

where $ho$ denotes a depth of the convex-concave structure, and at least one of the metal layers is metal or an alloy.

It is characterized that the metamaterial transferred substrate according to the present invention is obtained by transferring the inorganic layer onto the substrate from the layered product for metamaterial transfer according to the present invention.

According to the present invention, it is possible to easily form a large-area metamaterial layer on the substrate as a metamaterial layer transfer target.

DETAILED DESCRIPTION

As described above, it is difficult to obtain a large-area metamaterial or reduce cost when the metamaterial is manufactured on a substrate using a nanofabrication technique such as FIB fabrication. The inventors contrived to address such a problem, and as a result, it was revealed that a large-scaled metamaterial is easily obtained by forming unit cells of the metamaterial on a resin mold having a convex-concave structure and transferring the unit cells formed on the convex portion of the convex-concave structure onto the substrate.

The inventors found out a fact that the metamaterial property may be degraded due to oxidative degradation of silver (Ag) when silver (Ag) is used as a material of the metamaterial. In order to address such a problem, the inventors also found out a fact that the metamaterial property can be maintained over time by using an alloy rather than a single metal substance as a material of the metamaterial.

In addition, the inventors conceived a layered product for transfer capable of selectively transferring an inorganic layer on the convex portion of the convex-concave structure onto the substrate when a layered structure including metal and dielectric layers is formed as unit cells of the metamaterial using a deposition technique. Hereinafter, a structure of the layered product for metamaterial transfer according to an embodiment of the invention will be described in detail.

In the present embodiment, a metamaterial refers to a substance capable of realizing a physical property that may not be found in nature by combining significantly small elements (structures) relative to wavelengths of electromagnetic waves. In addition, a metamaterial layer according to an embodiment of the invention is obtained by stacking at least one metal layer and at least one dielectric layer and exhibits a function of the metamaterial. A layered product for metamaterial transfer according to an embodiment of the invention includes a resin mold and a metamaterial layer. By laminating the layered product for metamaterial transfer onto the substrate and releasing the resin mold, it is possible to transfer the metamaterial layer onto the substrate as a processing target and obtain a metamaterial transferred substrate.

Figure 1:
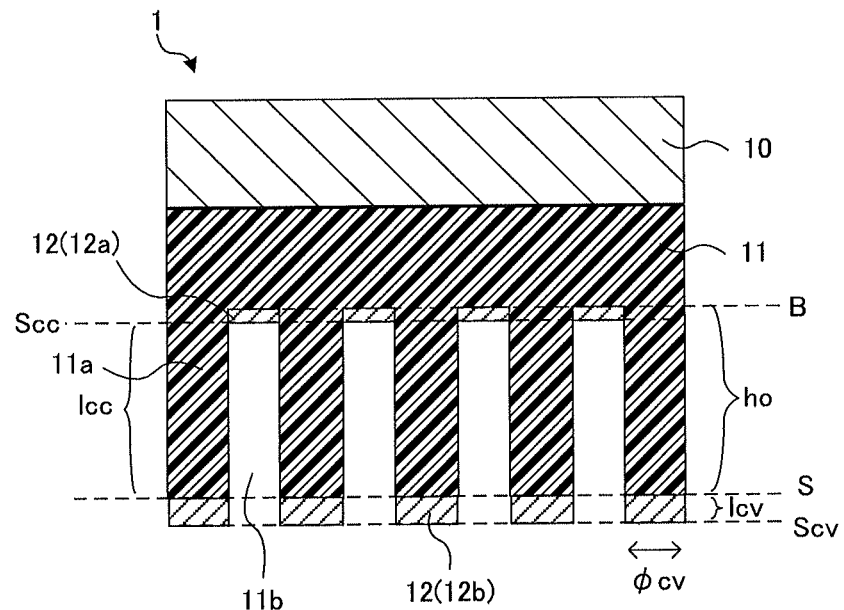
FIG. 1 is a schematic cross-sectional view illustrating an exemplary layered product for metamaterial transfer according to the present embodiment of the invention.

FIG. 1 is a schematic cross-sectional view illustrating a layered product for metamaterial transfer 1 according to an embodiment of the invention. As illustrated in FIG. 1, the layered product for metamaterial transfer 1 includes a support substrate 10, a resin mold 11 having a fine convex-concave structure on a surface provided on the principal face of the support substrate 10, and an inorganic layer 12 provided on the fine convex-concave structure of the resin mold 11. The inorganic layer 12 has a layered structure consisting of <at least one metal layer/at least one dielectric layer/at least one metal layer>.

In the resin mold 11, a single (e.g., line shape) or a plurality of (e.g., dot or grid shape) convex portion(s) 11a extending in a certain direction are provided with a predetermined interval along a direction perpendicular to the certain direction. That is, a plurality of convex portions 11a are formed across the entire face of the support substrate 10 as seen in a plan view. In addition, the convex portion 11a is protruded in a direction normal to the principal face of the support substrate 10 as seen in a cross-sectional view along a thickness direction of the layered product (as seen in a cross section normal to the perpendicular direction) as illustrated in FIG. 1. The concave portion 11b is formed between the convex portions 11a. The convex portion 11a and the concave portion 11b constitute a fine convex-concave structure.

In FIG. 1, the depth (height) ho of the fine convex-concave structure refers to the length (height) of the convex portion 11a or the depth of the concave portion 11b. In addition, the height ho of the fine convex-concave structure is the shortest distance between a bottom position B of the concave portion 11b and a top position of the convex portion 11a (position S described below). An aspect ratio expressed as a ratio ho/$\phi$cv between the width $\phi$cv and the height ho of the convex portion of the fine convex-concave structure is preferably set to 0.5 to 3.0. The aspect ratio is preferably equal to or greater than 0.5 from the viewpoint of the transfer capability of the inorganic layer 12 and is preferably equal to or smaller than 3.0 from the viewpoint of physical stability of the resin mold 11.

The position S of FIG. 1 refers to a top position of the convex portion 11a of the fine convex-concave structure. In addition, if there is a deviation in the height of the fine convex-concave structure, the position S refers to an plane average position of the top positions of each convex portion 11a. The average number is preferably set to 10 points or more.

The reference numerals 12a and 12b of FIG. 1 denote inorganic layers having a layered structure consisting of <at least one metal layer/at least one dielectric layer/at least one metal layer>. If the metal layer or the dielectric layer is formed on the convex portion 11a, the inorganic layer 12a having a layered structure consisting of <at least one metal layer/at least one dielectric layer/at least one metal layer> is arranged also inside the concave portion 11b.

By transferring the inorganic layer 12b of the convex portion 11a onto another substrate, it is possible to easily manufacture the large-are metamaterial layer.

The inorganic layer 12 serving as the metamaterial layer according to an embodiment of the invention is not particularly limited if it has a layered structure consisting of at least one metal layer/at least one dielectric layer/at least one metal layer. However, the inorganic layer 12 preferably contains a left-handed material capable of exhibiting a metamaterial function. Here, the left-handed material refers to a material (structure) having both negative electric permittivity $\in$ and negative magnetic permeability $\mu$ at the same time. Specifically, the left-handed material may include, for example, a multilayer structure alternately arranging metal layers and dielectric layers.

As the metal, Au, Ag, or an alloy containing Au or Ag or oxide semiconductor having conductivity through doping may be used. The oxide semiconductor may include indium oxide, tin oxide, zinc oxide, oxides of secondary composition metal such as In—Zn-based oxides, Sn—Zn-based oxides, Al—Zn-based oxides, Zn—Mg-based oxides, Sn—Mg-based oxides, In—Mg-based oxides, and In—Ga-based oxides, oxides of tertiary composition metal such as In—Ga—Zn-based oxides (also written IGZO), In—Al—Zn-based oxides, In—Sn—Zn-based oxides, Sn—Ga—Zn-based oxides, Al—Ga—Zn-based oxides, Sn—Al—Zn-based oxides, In—Hf—Zn-based oxides, In—Zr—Zn-based oxides, In—Ti—Zn-based oxides, In—Sc—Zn-based oxides, In—Y—Zn-based oxides, In—La—Zn-based oxides, In—Ce—Zn-based oxides, In—Pr—Zn-based oxides, In—Nd—Zn-based oxides, In—Sm—Zn-based oxides, In—Eu—Zn-based oxides, In—Gd—Zn-based oxides, In—Tb—Zn-based oxides, In—Dy—Zn-based oxides, In—Ho—Zn-based oxides, In—Er—Zn-based oxides, In—Tm—Zn-based oxides, In—Yb—Zn-based oxides, and In—Lu—Zn-based oxides, oxides of quarternary composition metal such as In—Sn—Ga—Zn-based oxides, In—Hf—Ga—Zn-based oxides, In—Al—Ga—Zn-based oxides, In—Sn—Al—Zn-based oxides, In—Sn—Hf—Zn-based oxides, In—Hf—Al—Zn-based oxides, and the like. In particular, an alloy (hereinafter called Ag—Pd alloy) comprising Ag and Pd, and containing at least one selected from a group consisting of Cu, Cr, Ti, Au, Al, and Rh is more preferable because its composition provides an optical property close to a single material of Ag and anti-corrosion/anti-oxidation property higher than that of a single material of Ag. In particular, if the aforementioned alloys or Au are used in the metal layer instead of a single material of Ag, it is possible to suppress aging degradation of the metamaterial property caused by oxidative degradation of Ag. The dielectric material may include $SiO_2$, $MgF_2$, $Al_2O_3$, or the like.

A layer configuration of the layered structure of the inorganic layer 12 may include: for example, a three-layer structure such as <a metal layer/a dielectric layer/a metal layer>; a four-layer structure such as <a metal layer/a metal layer/a dielectric layer,/a metal layer>; or a five-layer structure such as <a metal layer/a metal layer/a dielectric layer/a metal layer,/a metal layer>. In addition, the inorganic layer 12 may have a layered structure of the metal layer by interposing the dielectric layer or may have an alternating multilayer structure having a layered structure of metal layers and dielectric layers including: for example, five-layer structure such as <a metal layer/a dielectric layer/a metal layer/a dielectric layer/ and a metal layer>. Specifically, for example, the alternating multilayer structure may include an alternating multilayer structure of Ag and $MgF_2$, an alternating multilayer structure of Au and $SiO_2$, an alternating multilayer structure of Au and $Al_2O_3$, an alternating multilayer structure of APC (Ag—Pd—Cu alloy) and $MgF_2$, an alternating multilayer structure of APC and MgO, an alternating multilayer structure of APC and $SiO_2$, an alternating multilayer structure of APC and $Al_2O_3$, and the like. In addition, at least one of the metal layers of the alternating multilayer structure may be an alloy.

In particular, it is preferable to contain the multilayer layered structure of APC and $MgF_2$ or APC and $SiO_2$ from the viewpoint of a function of the metamaterial. A double fishnet structure can be established by providing periodic through-holes in the alternating multilayer structure, so that the transferred inorganic layer 12b exhibits a function of the metamaterial. A layer which doesn't have a function of the metamaterial but improves releasability between the resin mold and the inorganic layer 12b may be provided in the first layer on the convex portion of the resin mold 11. Such a releasing layer preferably has a thickness of 5 nm or greater in order to improve releasability of the inorganic layer 12b deposited through a vacuum process such as deposition.

The thickness of the inorganic layer 12a in the concave portion 11b within the plane of the resin mold 11 is preferably equal to or smaller than the thickness of the inorganic layer 12b on the convex portion 11a. If this relationship is satisfied, it is possible to improve the transfer precision for transferring only the inorganic layer 12b while the inorganic layer 12a remains in the inner side of the concave portion of a fine structure.

If the aforementioned structure is provided, it is preferable because the transfer precision of the inorganic layer 12b is improved while a metamaterial function of the transferred inorganic layer 12b is maintained.

The position Scv in FIG. 1 refers to a top face position of the inorganic layer 12b having a layered structure consisting of <at least one metal layer/at least one dielectric layer/at least one metal layer> formed in the top portion of the convex portion 11a of the fine convex-concave structure. If there is a deviation in the top face position of the inorganic layer 12b, the position Scv refers to an inplane average position of the top face position of the inorganic layer 12b on the convex portion 11a. The average number is preferably set to 10 or more.

The distance lcv in FIG. 1 refers to a distance between the position S and the position Scc. That is, the distance lcv refers to a thickness of the inorganic layer 12b having a layered structure of metal and the dielectric layer on the convex portion 11a. Therefore, if there is a deviation in the position S or the position Scc within the plane, an average value of the thickness of the inorganic layer 12b is used. It is preferable that the distance lcv be set to 0<lcv≤ho. The relationship 0<lcv is preferable from the viewpoint of a function of the transferred metamaterial, and the relationship lcv<ho is preferable from the viewpoint of physical stability of the inorganic layer 12b or transfer precision. In order to more improve the aforementioned effect, the distance lcv is set to, preferably, 0.2ho≤lcv≤0.9ho, or most preferably, 0.4ho≤lcv≤0.7ho.

The position Scc in FIG. 1 refers to a position of the exposed surface of the inorganic layer 12a having a layered structure including a dielectric layer and metal formed inside the concave portion 11b of the fine convex-concave structure. If there is a deviation in the position of the exposed surface of the inorganic layer 12a formed inside the concave portion 11b, the position Scc refers to an inplane average position of the surface position of the inorganic layer 12a of the concave portion 11b. The average number is preferably set to 10 or more. In addition, if the exposed surface of the inorganic layer 12a formed inside the concave portion 11b forms a curved surface, and a convex curved surface is formed under this curved surface, the position Scc refers to a place where the thickness of the inorganic layer 12a is minimized. If a convex curved surface is formed on this curved surface, the position Scc refers to a place where the thickness of the inorganic layer 12a is maximized.

The distance lcc in FIG. 1 refers to a distance between the position S and the position Scc. That is, the distance lcc refers to a value obtained by subtracting the thickness of the inorganic layer 12a inside the concave portion 11b within the plane of the resin mold 11 from the height ho of the fine convex-concave structure of a plurality of convex portions 11a within the plane of the resin mold 11. Therefore, if there is a deviation in the position S or the position Sec within the plane, both or any one of the average value of the height ho of the fine convex-concave structure and the average value of the thickness of the inorganic layer 12a is used.

It is preferable that this distance lcc satisfy a relationship 0<lcc≤1.0ho in order to form a fine array of the inorganic layer 12b by laminating the layered product for metamaterial transfer to a desired substrate. From the viewpoint of the transfer precision of the inorganic layer 12b, the distance lcc is set to, preferably, 0.2ho≤lcc≤1.0ho, or more preferably, 0.5ho≤lcc≤1.0ho in order to more improve the aforementioned effect.

The inorganic layer 12a and the inorganic layer 12b are preferably independent from each other in order to form the inorganic layer 12b through transfer. For example, it is preferable that the inorganic layer 12a and the inorganic layer 12b do not make contact with each other.

In addition, it is preferable that the thickness of the inorganic layer 12a inside the concave portion 11b within the plane of the resin mold 11 (the distance obtained by subtracting the distance lcc from ho) be equal to or smaller than the distance lcv. If this relationship is satisfied, it is preferable because the transfer precision of the inorganic layer 12b can be improved while the inorganic layer 12a remains inside the concave portion of the fine structure.

Figure 2:
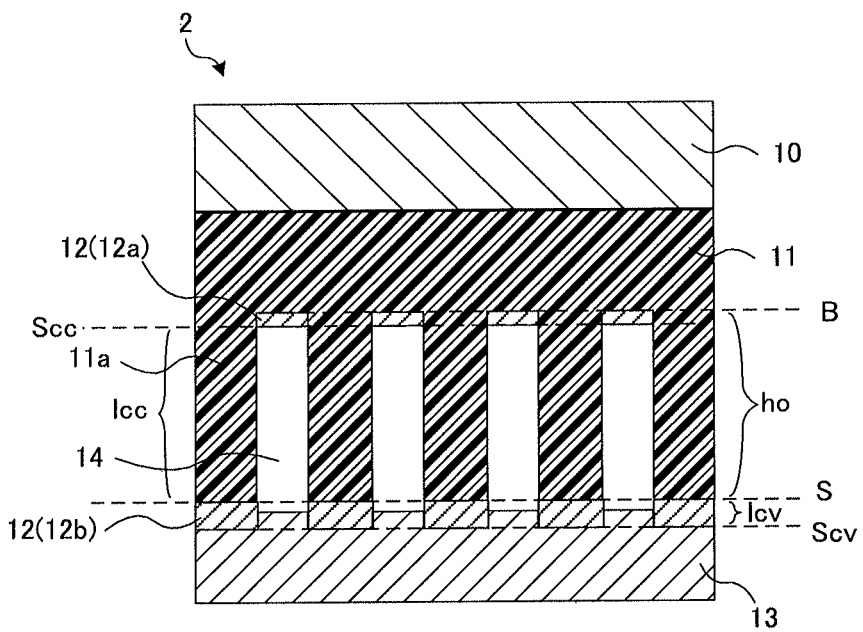
FIG. 2 is a schematic cross-sectional view illustrating an exemplary layered product for metamaterial transfer according to the present embodiment of the invention.

As illustrated in FIG. 2, the layered product for metamaterial transfer according to an embodiment of the invention may be provided with an adhesive layer 13 to cover the upper portion of the inorganic layer 12b. Hereinafter, the layered product for metamaterial transfer having the adhesive layer 13 will be referred to as a layered product 2 for metamaterial transfer.

In addition, a fact that the upper portion of the inorganic layer 12b is covered means that the adhesive layer 13 is provided on the inorganic layer 12b. Furthermore, a cavity 14 may be provided between the adhesive layer 13 and the inorganic layer 12a.

If the cavity 14 is provided, the inorganic layer 12a can remain inside the concave portion of the fine convex-concave structure when the inorganic layer 12 is transferred using the layered product 2 for metamaterial transfer. Therefore, the transfer precision of the inorganic layer 12b is more improved.

In addition, the cavity 14 may be filled with a liquid. If the cavity 14 is filled with a liquid, it is possible to improve adhesiveness between the substrate and the inorganic layer 12b or improve mold releasability of the inorganic layer 12b from the resin mold 11a when the inorganic layer 12b is transferred. As a result, the transfer precision of the inorganic layer 12b is more improved, which is preferable.

By providing the adhesive layer 13, it is possible to directly laminate the layered product 2 for metamaterial transfer to the substrate without forming the adhesive layer on the substrate when the inorganic layer 12b is formed on the substrate using the layered product 2 for metamaterial transfer. As a result, the transfer can be performed through laminating which is a general technique. Therefore, it is possible to more conveniently form the inorganic layer 12b on the substrate. That is, it is possible to easily manufacture a metamaterial (an inorganic layer having a layered structure consisting of <at least one metal layer/at least one dielectric layer/at least one metal layer> arranged in a fine structure) using a simple technique like as stacking.

Each denotation of the layered product 2 for metamaterial transfer illustrated in FIG. 2 is similar to that of the layered product for metamaterial transfer 1.

Hereinafter, detailed description will be made for materials of each element of the layered products for metamaterial transfer 1 and 2 and the like.

It is possible to easily transfer the inorganic layer 12b having a large-area layered structure consisting of <at least one metal layer/at least one dielectric layer/at least one metal layer> onto a target substrate by laminating and bonding the layered product for metamaterial transfer 1 onto the target substrate by interposing the adhesive layer and then releasing the resin mold 11. Meanwhile, it is possible to easily transfer a large-area inorganic layer 12b onto the target substrate by laminating and bonding the layered product for metamaterial transfer 2 having the adhesive layer onto the target substrate and then releasing the resin mold 11.

The adhesive layer 13 is not particularly limited if it can be bonded to the inorganic layer 12b and transfer the inorganic layer 12b. The transfer precision of the inorganic layer 12b is improved as the adhesiveness between the adhesive layer 13 and the inorganic layer 12b increases. For this reason, the transfer can be easily performed by appropriately selecting a composition of the adhesive layer side of the inorganic layer 12b and a composition of the adhesive layer 13.

As the adhesive layer 13, an adhesive, a bonding tape, photopolymerizable resin, thermopolymerizable resin, thermoplastic resin, a dry film resist, and the like commercially available may be employed. In addition, thermoplastic resin or PDMS having both functions of the adhesive layer and the substrate may be employed. It is preferable that a cavity be provided between the face of the adhesive layer 13 in the fine convex-concave structure side and the position Scc formed by the inorganic layer 12a inside the concave portion from the viewpoint of the transfer capability of the inorganic layer 12b. Furthermore, it is preferable that the inorganic layer 12b be partially covered by the adhesive layer 13 in the height direction. That is, it is preferable that the intrusion thickness of the adhesive layer 13 that intrudes into the bottom side of the concave portion be smaller than the distance lcv if the top position Scv of the inorganic layer 12b is starting point.

In addition, a material of the adhesive layer for forming the metamaterial through transfer using the layered product for metamaterial transfer 1 may be similar to that of the adhesive layer 13 of the layered product for metamaterial transfer 2.

In addition, from the viewpoint of a handling for laminating the layered product for metamaterial transfer 2 to the transfer target substrate using the layered product including the resin mold 11, the inorganic layer 12, and the adhesive layer 13, the adhesive layer 13 may be thermo-compressively bondable resin such as a dry film resist or resin having independence and tackiness at a room temperature. In this case, a layered product including the resin mold 11, the inorganic layer 12, and the adhesive layer 13 may be manufactured and retrieved together with the cover film in a winding manner. This roll may be unwound and easily laminated to a desired substrate in a thermo-compressive manner.

The target substrate for forming the inorganic layer 12b using the layered products for metamaterial transfer 1 and 2 may be selected depending on its use without a particular limitation. For example, it may be selected from film substrates to inorganic substrates commercially available. In addition, by using a material having both functions of the substrate and the adhesive layer, it is possible to manufacture a metamaterial only using the adhesive layer without the substrate. Such a material may include thermoplastic resin, PDMS, and the like.

The fine convex-concave structure of the resin mold 11 in the layered products for metamaterial transfer 1 and 2 may have a pillar shape or a hole shape. Although not particularly limited thereto, the hole shape is preferable from the view point of transfer a structure such as a double fishnet structure. In the case of the pillar shape, it is possible to form an independent inorganic layer 12b through transfer. In the case of the hole shape, it is possible to form a successive inorganic layer 12b through transfer. Although not particularly limited thereto, its structure is preferably a line-and-space structure or a pillar shape or a hole shape having a plurality of convex portions having a conical shape, an angled pyramid shape, or an oval pyramid shape.

Here, the pillar shape refers to a shape in which a plurality of pillar bodies (pyramid shape) are arranged, and the hole shape refers to a shape in which a plurality of pillar-shaped (pyramid-shaped) holes are formed. In addition, in the convex-concave structure, it is preferable that the distance between convex portions be equal to or greater than 50 nm and equal to or smaller than 1000 nm, and the height of the convex portion be equal to or greater than 50 nm and equal to or smaller than 1000 nm. It is preferable that the neighboring distance between convex portions (interval between apexes of the convex portions) be small, and the height of the convex portion (the height from the bottom of the concave portion to the apex of the convex portion) be high depending on the utilization. Here, the convex portion refers to a portion higher than the average height of the fine convex-concave structure, and the concave portion refers to a portion lower than the average height of the fine convex-concave structure.

The material of the support substrate 10 is not particularly limited and may include an inorganic material such as glass, ceramic, and metal or an organic material such as plastic. Depending on the utilization of a molded body, the support substrate 10 may include a plate, a sheet, a film, a thin film, woven fabrics, nonwoven fabrics, any other shapes, or a combination thereof. However, in order to easily transfer a large-area metamaterial, it is particularly preferable that the support substrate 10 include a sheet, a film, a thin film, woven fabrics, nonwoven fabrics, and the like having flexibility and consecutive productivity. A flexible material may include: for example, amorphous thermoplastic resin such as polymethyl methacrylate resin, polycarbonate resin, polystyrene resin, cycloolefin resin (COP), crosslinked polyethylene resin, polyvinyl chloride resin, polyacrylate resin, polyphenylene ether resin, modified polyphenylene ether resin, polyetherimide resin, polyethersulfone resin, polysulfone resin, and polyetherketone resin; crystalline thermoplastic resin such as polyethylene terephthalate (PET) resin, polyethylenenaphthalate resin, polyethylene resin, polypropylene resin, polybutylene terephthalate resin, aromatic polyester resin, polyacetal resin, and polyamide resin; ultra violet rays (UV)-curable resin or thermosetting resin such as acryl-based, epoxy-based, urethane-based resin. In addition, the support substrate 10 may be made by using combination of UV-curable resin or thermosetting resin with an inorganic substrate such as glass or the aforementioned thermoplastic resin or triacetate resin or may be made by using solely them.

In order to improve adhesiveness between the support substrate 10 and the resin mold 11, easy adhesive coating, primer treatment, corona treatment, plasma treatment, UV/ozone treatment, high-energy beam irradiation treatment, surface roughening treatment, porosity treatment, and the like for forming a chemical bond with the resin mold 11 or a physical bond such as penetration may be applied to a principal face of the support substrate 10 where the resin mold 11 is provided.

It is preferable that the resin mold 11 contain elemental fluorine and/or a methyl group in order to decrease a bonding strength between the inorganic layer 12b and the resin mold 11 and improve transfer precision. The resin mold 11 is not particularly limited if it is made of polydimethyl siloxane (PDMS) resin or fluorine-containing resin, and is preferably made of fluorine-containing resin. The fluorine-containing resin is not particularly limited if it contains elemental fluorine and has a contact angle of 90° or greater to water. However, from the viewpoint of the transfer precision for transferring the inorganic layer 12 onto the inorganic substrate, a contact angle to water is set to, preferably, 95° or greater or, more preferably, 100° or greater.

It is preferable that the fluorine concentration Es on the resin surface of the resin mold 11 (in the vicinity of the fine convex-concave structure) be higher than the average fluorine concentration Eb of the resin mold 11. As a result, free energy of the resin surface is low. Therefore, it is possible to obtain a resin mold 11 having excellent mold releasability from the transfer material resin or the inorganic layer and capable of performing resin-to-resin transfer by repeating the nanometer-size convex-concave shape and improve adhesiveness by increasing and maintaining the free energy in the vicinity of the support substrate 10.

It is preferable that a ratio between the average elemental fluorine concentration Eb of the resin contained in the resin mold 11 and the elemental fluorine concentration Es on the surface of the resin mold 11 satisfy a relationship $5.0<Es/Eb\leq200$, which more improves the aforementioned effect. In particular, it is more preferable that the ratio satisfy a relationship $10\leq Es/Eb\leq180$ and it much more preferable that the ratio satisfy a relationship $15\leq Es/Eb\leq170$, which more improves the mold releasability.

In addition, if the ratio satisfies a relationship $25\leq Es/Eb\leq170$ out of the broadest range ($5.0<Es/Eb\leq200$) described above, the elemental fluorine concentration Es of the surface portion of the resin mold 11 is sufficiently higher than the average fluorine concentration Eb of the resin mold 11, and the free energy on the resin surface effectively decreases. As a result, it is possible to improve the mold releasability with the transfer material resin or the inorganic layer 12b including <at least one metal layer/at least one dielectric layer/at least one metal layer>, and the adhesive layer 13.

In addition, if the average elemental fluorine concentration Eb of the resin mold 11 is relatively lower than the elemental fluorine concentration Es on the surface of the resin mold 11, it is possible to improve the strength of the resin itself and maintain high free energy in the vicinity of the support substrate 10 in the resin mold 11, which improves adherence to the support substrate 10. As a result, it is possible to improve the adherence to the support substrate 10 and the mold releasability from the inorganic layer 12b and obtain a resin mold 11 capable of repeatedly transferring a convex-concave shape of a nanometer size from resin to resin, which is particularly preferable.

In addition, if the relationship $155\leq Es/Eb\leq160$ is satisfied, it is possible to lower the free energy of the surface of the resin mold 11 and improve the repetitive transfer capability, which is preferable. In addition, if the relationship $19\leq Es/Eb\leq160$ is satisfied, it is possible to lower the free energy of the surface of the resin mold 11, maintain the strength of the resin, and more improve the repetitive transfer capability, which is preferable. It is more preferable that the relationship $255\leq Es/Eb\leq100$ be satisfied. If the relationship $30\leq Es/Eb\leq70$ is satisfied, it is possible to more improve the aforementioned effect, which is preferable.

Out of the resin of the resin mold 11, photopolymerizable radical polymerization-type resin preferably includes a curable resin composition which is a mixture of the photopolymerization initiator, non-fluorine-containing (meth)acrylate, fluorine-containing (meth)acrylate. If such a curable resin composition is used and cured while it makes contact with a hydrophobic interface and the like having low surface free energy, it is possible to increase the elemental fluorine concentration Es of the surface of the resin mold 11 over the average elemental fluorine concentration Eb of the resin of the resin mold 11. In addition, it is possible to perform adjustment to reduce the average elemental fluorine concentration Eb of the resin.

(A) (Meth)Acrylate

Any polymerizable monomer other than the fluorine-containing (meth)acrylate described below (in paragraph (B)) may be used as (meth)acrylate without limitation. Preferably, the (meth)acrylate includes monomer having a acryloyl group or a methacryloyl group, monomer having a vinyl group, or monomer having a Allyl group. More preferably, the (meth)acrylate includes monomer having a acryloyl group or a methacryloyl group. In addition, it is preferable that they be non-fluorine-containing monomer. The (meth)acrylate refers to acrylate or methacrylate.

It is preferable that the polymerizable monomer include polyfunctional monomer having a plurality of polymerizable groups. The number of polymerizable groups is preferably set to an integer 1 to 4 for excellent polymerizability. In addition, if two or more types of polymerizable monomer are mixedly used, the average number of polymerizable groups is preferably set to 1 to 3. If a single type of monomer is used, it is preferable that the number of polymerizable groups be set to 3 or greater in order to increase the cross-linking points after a polymerizing reaction and obtain physical stability (strength, heat resistance, and the like) of the cured material. In addition, if the number of polymerizable groups of the monomer is set to 1 or 2, it is preferable to mixedly use monomer having a different number of polymerizable groups.

For example, the (meth)acrylate monomer may include the following compounds. That is, (meth)acrylate monomer may include monomer having an acryloyl group or a methacryloyl group such as (meth)acrylic acid, aromatic-series-based (meth)acrylate (such as phenoxyethyl acrylate and benzyl acrylate), hydrocarbon-based (meth)acrylate (such as stearyl acrylate, lauryl acrylate, 2-ethyl hexyl acrylate, allyl acrylate, 1,3-butandiol diacrylate, 1,4-butandiol diacrylate, 1,6-hexanediol diacrylate, trimethylolpropane triacrylate, pentaerythritol triacrylate, and dipentaerythritol hexacrylate), hydrocarbon-based (meth)acrylate containing an ether oxygen atom (such as ethoxyethyl acrylate, methoxyethyl acrylate, glycidyl acrylate, tetrahydrofurfuryl acrylate, diethylene glycol diacrylate, neopentylglycol diacrylate, polyoxyethylene glycol diacrylate, and tripropylene glycol diacrylate), hydrocarbon-based (meth)acrylate containing a functional group (such as 2-hydroxyethyl acrylate, 2-hydroxypropyl acrylate, 4-hydroxybutyl vinyl ether, N,N-(diethylamino) ethyl acrylate, N,N-(dimethylamino)ethyl acrylate, N-vinyl pyrrolidone, and (dimethylamino)ethyl methacrylate), or silicon-based acrylate. In addition, the monomer having a acryloyl group or a methacryloyl group may include EO-modified glycerol tri(meth)acrylate, ECH-modified glycerol tri(meth) acrylate, PO-modified glycerol tri(meth)acrylate, pentaerythritol triacrylate, EO-modified triacrylate phosphate, trimethylolpropane tri(meth)acrylate, caprolactone-modified trimethylolpropane tri(meth)acrylate, PO-modified trimethylolpropane tri(meth)acrylate, tris(acryloxyethyl)isocyanulate, EO-modified trimethylolpropane tri(meth)acrylate, dipentaerythritol hexa(meth)acrylate, caprolactone-modified dipentaerythritol hexa(meth)acrylate, dipentaerythritol hydroxy penta(meth)acrylate, alkyl-modified dipentaerythritol penta(meth)acrylate, dipentaerythritol poly(meth)acrylate, ditrimethylol propane tetra(meth)acrylate, alkyl-modified dipentaerythritol tri(meth)acrylate, pentaerythritol ethoxy tetra(meth)acrylate, pentaerythritol tetra(meth)acrylate, di(ethylene glycol)monoethyl ether(meth)acrylate, dimethylol dicyclopentane di(meth)acrylate, di(metha)acrylated isocyanulate, 1,3-butylene glycol di(meth)acrylate, 1,4-butanediol di(meth)acrylate, EO-modified 1,6-hexanediol di(meth)acrylate, ECH-modified 1,6-hexanediol di(meth) acrylate, aryloxy polyethylene glycol acrylate, 1,9-nonanediol di(meth)acrylate, EO-modified bisphenol-A di(meth)acrylate, PO-modified bisphenol-A di(meth)acrylate, modified bisphenol-A di(meth)acrylate, EO-modified bisphenol Fdi(meth)acrylate, ECH-modified hexahydrophthalic diacrylate, neopentylglycol di(meth)acrylate, hydroxypivalic acid neopentylglycol di(meth)acrylate, EO-modified neopentylglycol diacrylate, PO-modified neopentylglycol diacrylate, caprolactone-modified hydroxypivalic acid ester neopentylglycol, stearic-acid-modified pentaerythritol di(meth)acrylate, ECH-modified propylene glycol di(meth)acrylate, ECH-modified phthalic acid di(meth)acrylate, poly(ethyleneglycol-tetramethyleneglycol)di(meth) acrylate, poly(propylene glycol tetramethyleneglycol)di (meth)acrylate, polypropylene glycol di(meth)acrylate, silicon di(meth)acrylate, tetraethyleneglycol di(meth)acrylate, triethyleneglycol di(meth)acrylate, polyester (di)acrylate, polyethyleneglycol di(meth)acrylate, dimethylol tricyclodecane di(meth)acrylate, neopentylglycol-modified trimethylol propane di(meth)acrylate, dipropylene glycol di(meth)acrylate, tripropylene glycol di(meth)acrylate, triglycerol di(meth)acrylate, EO-modified tripropylene glycol di(meth)acrylate, divinyl ethylene urea, divinyl propylene urea, 2-ethyl-2-buthyl propanediol acrylate, 2-ethyl hexyl(meth)acrylate, 2-ethyl hexyl carbitol(meth)acrylate, 2-hydroxyethyl(meth)acrylate, 2-hydroxypropyl(meth)acrylate, 2-hydroxy buthyl(meth)acrylate, 2-methoxyethyl(meth) acrylate, 3-methoxy buthyl(meth)acrylate, 4-hydroxy buthyl (meth)acrylate, acrylic acid dimer, benzyl(meth)acrylate, butanediol mono(meth)acrylate, butoxyethyl(meth)acrylate, buthyl(meth)acrylate, cethyl(meth)acrylate, EO-modified cresol(meth)acrylate, ethoxylated phenyl(meth)acrylate, ethyl(meth)acrylate, dipropylene glycol(meth)acrylate, isoamyl (meth)acrylate, isobuthyl(meth)acrylate, isooctyl(meth) acrylate, cyclohexyl(meth)acrylate, dicyclopentanyl(meth) acrylate, isobornyl(meth)acrylate, dicyclopentanyloxyethyl (meth)acrylate, isomyristyl(meth)acrylate, lauryl(meth) acrylate, methoxy dipropylene glycol(meth)acrylate, methoxy polyethylene glycol(meth)acrylate, methoxy triethylene glycol(meth)acrylate, methyl(meth)acrylate, methoxy tripropylene glycol(meth)acrylate, neopentylglycol benzoate (meth)acrylate, nonylphenoxy polyethylene glycol(meth) acrylate, nonylphenoxy polypropylene glycol(meth)acrylate, octyl(meth)acrylate, paracumyl phenoxy ethylene glycol (meth)acrylate, ECH-modified phenoxy acrylate, phenoxy diethylene glycol(meth)acrylate, phenoxy hexaethyleneglycol(meth)acrylate, phenoxy tetra ethyleneglycol(meth)acrylate, phenoxyethyl(meth)acrylate, polyethylene glycol(meth) acrylate, polyethylene glycol-polypropylene glycol(meth) acrylate, polypropylene glycol(meth)acrylate, stearyl(meth) acrylate, EO-modified succinic acid(meth)acrylate, tert-buthyl(meth)acrylate, tribromophenyl(meth)acrylate, EO-modified tribromophenyl(meth)acrylate, tridodecyl (meth)acrylate, isocyanuric acid EO-modified di-/tri-acrylate, s-caprolactone-modified tris(acryloxyethyl)isocyanulate, ditrimethylol propane tetraacrylate, and the like. The monomer having allyl group may include p-isopropenyl phenol, and the monomer having a vinyl group such as styrene, α-methyl styrene, acrylonitrile, and vinylcarbazole. Here, the "EO-modified" refers to ethylene oxide modification, the "ECH-modified" refers to epichlorohydrin modification, and the "PO-modified" refers to propylene oxide modification.

(B) Fluorine-Containing (Meth)Acrylate

It is preferable that the fluorine-containing (meth)acrylate has a polyfluoroalkylene chain and/or a perfluoro(polyoxyalkylene) chain and a polymerizable group. More preferably, the fluorine-containing (meth)acrylate has a straight-chained perfluoroalkylene group or a perfluoro oxyalkylene group which has an ether oxygen atom inserted between carbon atoms and has a trifluoro methyl group in the side chain. Particularly, it is preferable that the fluorine-containing (meth)acrylate have a straight-chained polyfluoro alkylene chain and/or a straight-chained perfluoro(polyoxyalkylene) chain which has a trifluoro methyl group in a molecular side chain or a distal end of the molecular structure.

The polyfluoro alkylene chain preferably includes a polyfluoro alkylene group having a carbon number of 2 to 24. In addition, the polyfluoro alkylene group may have a functional group.

The perfluoro(polyoxyalkylene) chain preferably includes at least one or more perfluoro(oxyalkylene) unit selected from a group consisting of a $(CF_2CF_2O)$ unit, a $(CF_2CF(CF_3)O)$ unit, a $(CF_2CF_2CF_2O)$ unit, and a $(CF_2O)$ unit. More preferably, the perfluoro(polyoxyalkylene) chain includes a $(CF_2CF_2O)$ unit, a $(CF_2CF(CF_3)O)$ unit, or a $(CF_2CF_2CF_2O)$ unit. Particularly, it is preferable that the perfluoro(polyoxyalkylene) chain include a $(CF_2CF_2O)$ unit for excellent physical properties (such as heat resistance or acid resistance) of the fluorine-containing polymer. The number of perfluoro(oxyalkylene) units is set to, preferably, an integer of 2 to 200 or, more preferably, an integer of 2 to 50 for excellent mold releasability and high hardness of the fluorine-containing polymer.

Preferably, the polymerizable group includes a vinyl group, an allyl group, an acryloyl group, a methacryloyl group, an epoxy group, a dioxetane group, a cyano group, an isocyanate group, or a hydrolytic cyril group expressed as —(CHO2)aSi(M1)3-b(M2)b. More preferably, the polymerizable group includes an acryloyl group or a methacryloyl group. Here, the coefficient "M1" denotes a substituent converted into a hydroxyl group by the hydrolysis reaction. Such a substituent may include a halogen atom, an alkoxy group, an acyloxy group, and the like. A chlorine atom is preferably used as the halogen atom. The alkoxy group includes, preferably, a methoxy group or an ethoxy group or, more preferably, a methoxy group. The substituent M1 includes, preferably, alkoxy group or, more preferably, a methoxy group. The coefficient "M2" denotes a monovalent hydrocarbon. M2 may include an alkyl group, an alkyl group which is substituted by one or more allyl groups, an alkenyl group, an alkynyl group, a cycloalkyl group, an allyl group, and the like. Preferably, M2 includes an alkyl group or an alkenyl group. If M2 includes an alkyl group, an alkyl group having a carbon number of 1 to 4 is preferably used, and a methyl group or an ethyl group is more preferable. If M2 includes an alkenyl group, an alkenyl group having a carbon number of 2 to 4 is preferably used, and a vinyl group or an allyl group is more preferable. The coefficient "a" denotes an integer of 1 to 3 and is preferably set to 3. The coefficient "b" denotes 0 or an integer of 1 to 3 and is preferably set to 0. The hydrolytic cyril group preferably includes $(CH_3O)_3SiCH_2$—, $(CH_3CH_2O)_3SiCH_2$—, $(CH_3O)_3Si(CH_2)_3$—, or $(CH_3CH_2O)_3Si(CH_2)_3$—.

The number of polymerizable groups is set to, preferably, an integer of 1 to 4 or, more preferably, an integer of 1 to 3 for excellent polymerizability. If two or more types of compounds are used, the average number of polymerizable groups is preferably set to 1 to 3.

The fluorine-containing (meth)acrylate has excellent adherence to a transparent substrate if the fluorine-containing (meth)acrylate has a functional group. The functional group may include a carboxyl group, a sulfonate group, a functional group having an ester bond, a functional group having an amide bond, a hydroxyl group, an amino group, a cyano group, a urethane group, an isocyanate group, a functional group having an isocyanuric acid derivative, and the like. Particularly, it is preferable that the fluorine-containing (meth)acrylate contain at least one functional group selected from a group consisting of a carboxyl group, a urethane group, and a functional group having an isocyanuric acid derivative. In addition, the isocyanuric acid derivative may have an isocyanuric acid structure in which at least a hydrogen atom bonded to a nitrogen atom is substituted with any other group. The fluorine-containing (meth)acrylate may include fluoro(meth)acrylate, fluorodiene, and the like. For example, the fluorine-containing (meth)acrylate may include compound as follows.

The fluoro(meth)acrylate may include $CH_2\!\!=\!\!CHCOO(CH_2)_2(CF_2)_{10}F$, $CH_2\!\!=\!\!CHCOO(CH_2)_2(CF_2)_8F$, $CH_2\!\!=\!\!CHCOO(CH_2)_2(CF_2)_6F$, $CH_2\!\!=\!\!C(CH_3)COO(CH_2)_2(CF_2)_{10}F$, $CH_2\!\!=\!\!C(CH_3)COO(CH_2)_2(CF_2)_8F$, $CH_2\!\!=\!\!C(CH_3)COO(CH_2)_2(CF_2)_6F$, $CH_2\!\!=\!\!CHCOOCH_2(CF_2)_6F$, $CH_2\!\!=\!\!C(CH_3)COOCH_2(CF_2)_6F$, $CH_2\!\!=\!\!CHCOOCH_2(CF_2)_7F$, $CH_2\!\!=\!\!C(CH_3)COOCH_2(CF_2)_7F$, $CH_2\!\!=\!\!CHCOOCH_2CF_2CF_2H$, $CH_2\!\!=\!\!CHCOOCH_2(CF_2CF_2)_2H$, $CH_2\!\!=\!\!CHCOOCH_2(CF_2CF_2)_4H$, $CH_2\!\!=\!\!C(CH_3)COOCH_2(CF_2CF_2)H$, $CH_2\!\!=\!\!C(CH_3)COOCH_2(CF_2CF_2)_2H$, $CH_2\!\!=\!\!C(CH_3)COOCH_2(CF_2CF_2)_4H$, $CH_2\!\!=\!\!CHCOOCH_2CF_2OCF_2CF_2OCF_3$, $CH_2\!\!=\!\!CHOCOOCHO_2CF_2O(CF_2CF_2O)_3CF_3$, $CH_2\!\!=\!\!C(CH_3)COOCH_2CF_2OCF_2CF_2OCF_3$, $CH_2\!\!=\!\!C(CH_3)COOCH_2CF_2O(CF_2CF_2O)_3CF_3$, $CH_2\!\!=\!\!CHCOOCH_2CF(CF_3)OCF_2CF(CF_2)O(CF_2)_3F$, $H_2\!\!=\!\!CHCOOCH_2CF(CF_3)O(CF_2CF(CF_3)O)_2(CF_2)_3F$, $CH_2\!\!=\!\!C(CH_3)COOCH_2CF(CF_3)OCF_2CF(CF_3)O(CF_2)_3F$, $CH_2\!\!=\!\!C(CH_3)COOCH_2CF(CF_3)O(CF_2CF(CF_3)O)_2(CF_2)_3F$, $CH_2\!\!=\!\!CFCOOCH_2CH(OH)CH_2(CF_2)_6CF(CF_3)_2$, $CH_2\!\!=\!\!CFCOOCH_2CH(CH_2OH)CH_2(CF_2)_6CF(CF_3)_2$, $CH_2\!\!=\!\!CFCOOCH_2CH(OH)CH_2(CF_2)_{10}F$, $CH_2\!\!=\!\!CFCOOCH_2CH(OH)CH_2(CF_2)_{10}F$, $CH_2\!\!=\!\!CHCOOCH_2CH_2(CF_2CF_2)_3CH_2CH_2OCOCH\!\!=\!\!CH_2$, $CH_2\!\!=\!\!C(CH_3)COOCH_2CH_2(CF_2CF_2)_3CH_2CH_2OCOC(CH_3)\!\!=\!\!CH_2$, $CH_2\!\!=\!\!CHCOOCH_2CyFCH_2OCOCH\!\!=\!\!CH_2$, $CH_2\!\!=\!\!C(CH_3)COOCH_2CyFCH_2OCOC(CH_3)\!\!=\!\!CH_2$, and the like (where CyF denotes perfluoro(1,4-cyclohexylene group).

The fluorodiene may include $CF_2\!\!=\!\!CFCF_2CF\!\!=\!\!CF_2$, $CF_2\!\!=\!\!CFOCF_2CF\!\!=\!\!CF_2$, $CF_2\!\!=\!\!CFOCF_2CF_2CF\!\!=\!\!CF_2$, $CF_2\!\!=\!\!CFOCF(CF_2)CF_2CF\!\!=\!\!CF_2$, $CF_2\!\!=\!\!CFOCF_2CF(CF_3)CF\!\!=\!\!CF_2$, $CF_2\!\!=\!\!CFOCF_2OCF\!\!=\!\!CF_2$, $CF_2\!\!=\!\!CFOCF_2CF(CF_3)OCF_2CF\!\!=\!\!CF_2$, $CF_2\!\!=\!\!CFCF_2C(OH)(CF_3)CH_2CH\!\!=\!\!CH_2$, $CF_2\!\!=\!\!CFCF_2C(OH)(CF_3)CH\!\!=\!\!CH_2$, $CF_2\!\!=\!\!CFCF_2C(CF_3)(OCH_2OCH_3)CH_2CH\!\!=\!\!CH_2$, $CF_2\!\!=\!\!CFCH_2C(C(CF_3)_2OH)(CF_3)CH_2CH\!\!=\!\!CH_2$, and the like.

The fluorine-containing (meth)acrylate according to an embodiment of the invention may include fluorine-containing urethane(meth)acrylate expressed in the following chemical formula (1) or chemical formula (4). As a result, it is possible to effectively increase the elemental fluorine concentration Es of the surface of the resin mold 11 while the average elemental fluorine concentration Eb of the resin is lowered and more effectively realize mold releasability and adhesiveness to the substrate, which is more preferable. As the urethane(meth)acrylate, for example, "OPTOOL (registered trademark) DAC" produced by DAIKIN INDUSTRIES Co., Ltd. may be used. In addition, as the fluorine-containing (meth)acrylate expressed in the chemical formula (4), for example, "CHEMINOX FAMAC-6" produced by UNIMATEC Co., Ltd. may be used.

[Chemical Formula 1]

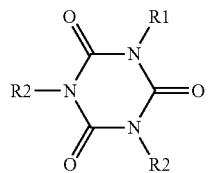

chemical formula (1)

where R1 denotes the following chemical formula (2), and R2 denotes the following chemical formula (3).

[Chemical Formula 2]

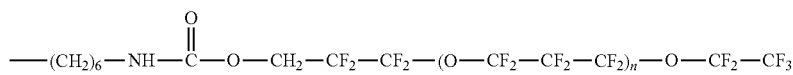

chemical formula (2)

where n denotes an integer equal to or greater than 1 and equal to or smaller than 6.

[Chemical Formula 3]

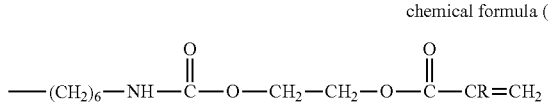

chemical formula (3)

where R denotes H or $CH_3$.

[Chemical Formula 4]

chemical formula (4)

$F(CF_2)_6CH_2OCOC(CH_3)=CH_2$

A single type of fluorine-containing (meth)acrylate may be solely used, or two or more types of fluorine-containing (meth)acrylate may be mixedly used. In addition, a surface modifier may be mixedly used for improving wear resistance, defect resistance, anti-fingerprint, anti-fouling, a leveling property, a water and oil repelling property, and the like. For example, the modifier may include "FUTAGENT (registered trademark)" produced by NEOS Co., Ltd. (for example, including an M-series such as FUTAGENT 251, FUTAGENT 215M, FUTAGENT 250, FTX-245M, and FTX-290M, an S-series such as FTX-207S, FTX-211S, FTX-220 S, and FTX-230S, an F-series such as FTX-209F, FTX-213F, FUTAGENT 222F, FTX-233F, and FUTAGENT 245F, a G-series such as FUTAGENT 208G, FTX-218G, FTX-230G, and FTS-240G, an oligomer series such as FUTAGENT 730FM and FUTAGENT 730LM, and a P-series such as FUTAGENT 710FL and FTX-710HOL, and the like); "MEGAFAC (registered trademark)" produced by DAINIPPON Ink and Chemicals, Inc. (for example, including F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, and the like); "OPTOOL™ (such as DSX, DAC, and AES)," "FTONE™ (such as AT-100)," "ZEFFLE (registered trademark)(such as GHO-701)," "UNIDYNE TEMPORARY MEMORY," "DAIFREE (registered trademark)," and "OPTOACE (registered trademark)" produced by DAIKIN INDUSTRIES Co., Ltd.; "NOVEC (registered trademark) EGC-1720" produced by SUMITOMO 3M Co., Ltd.; "FLUOROSURF (registered trademark)" produced by FLUORO TECHNOLOGY Corp., and the like.

Preferably, the fluorine-containing (meth)acrylate has a molecular weight Mw of 50 to 50000. The molecular weight Mw is set to, preferably, 50 to 5000 or, more preferably, 100 to 5000 from the viewpoint of mutual solubility. A solvent used for dilution may be used if the mutual solubility is low, and the molecular weight is high. As the solvent, a single type of solvent may have a boiling point of, preferably, 40 to 180° C., more preferably, 60 to 180° C., or, still more preferably, 60 to 140° C. Two or more types of solvents may be used.

The solvent content may be set such that at least it can be dispersed in the curable resin composition. It is preferable that the solvent content be more than 0 parts by weight and equal to or less than 50 parts by weight against 100 parts by weight of the curable composition. More preferably, the solvent content is more than 0 parts by weight and equal to or less than 10 parts by weight considering a case where the solvent remaining after drying is removed without limitation.

Particularly, if the solvent is contained for improving the leveling property, it is preferable that the solvent content be equal to or more than 0.1 parts by weight and equal to or less than 40 parts by weight against 100 parts by weight of (meth) acrylate. If the solvent content is equal to or more than 0.5 parts by weight and equal to or less than 20 parts by weight, it is possible to maintain curability of the photopolymerizable mixture, which is preferable. More preferably, the solvent content is equal to or more than 1 parts by weight and equal to or less than 15 parts by weight. If the solvent is contained for reducing the thickness of the photopolymerizable mixture, it is preferable that the solvent content be equal to or more than 300 parts by weight and equal to or less than 10000 parts by weight against 100 parts by weight of (meth)acrylate because liquid stability can be maintained in a drying process after coating. More preferably, the solvent content is equal to or more than 300 parts by weight and equal to or less than 1000 parts by weight.

(C) Photopolymerization Initiator

A photopolymerization initiator generates radical reaction or ionic reaction using light. Preferably, a photopolymerization initiator capable of generating radical reaction is used. The photopolymerization initiator may include following materials.

The photopolymerization initiator may include an acetophenon-based photopolymerization initiator such as acetophenone, p-tert-butyltrichloro acetophenone, chloroacetophenone, 2,2-diethoxy acetophenone, hydroxy acetophenone, 2,2-dimethoxy-2'-phenylacetophenone, 2-aminoacetophenone, and dialkylaminoacetophenone; a benzoin-based photopolymerization initiator such as benzyl, benzoin, benzoin methyl ether, benzomethylether, benzoin isopropyl ether, benzoin isobutyl ether, 1-hydroxy cyclohexyl phenyl ketone, 2-hydroxy-2-methyl-1-phenyl-2-methyl propane-1-one, 1-(4-isopropyl phenyl)-2-hydroxy-2-methyl propane-1-one, and benzyl dimethyl ketal; a benzophenone-based photopolyismerization initiator such as benzophenone, benzoyl benzoic acid, benzoyl benzoic acid methyl, methyl-o-benzoylbenzoate, 4-phenylbenzophenone, hydroxy benzophenone, hydroxy propylbenzophenone, acrylbenzophenone, 4,4'-bis(dimethylamino)benzophenone, and perfluorobenzophenone; a thioxanthone-based photopolymerization initiator such as thioxanthone, 2-chlorothioxanthone, 2-methylthioxanthone, diethylthioxanthone, and dimethylthioxanthone; an anthraquinone-based photopolymerization initiator such as 2-methyl anthraquinone, 2-ethyl anthraquinone, 2-tert-buthyl anthraquinone, 1-chloro anthraquinone, and 2-amyl anthraquinone; or a ketal-based photopolymerization initiator such as acetophenone dimethyl ketal and benzyl dimethyl ketal. Other photopolymerization initiator may include α-acyl oxime ester, benzyl-(o-ethoxycarbonyl)-α-monooxime, acyl phosphine oxide, glyoxy ester, 3-ketocoumarin, 2-ethyl anthraquinone, camphorequinone, tetramethylthiuram sulfide, azobis isobutyronitrile, benzoyl peroxide, dialkyl peroxide, tert-buthyl peroxypivalate. A photopolymerization initiator having a fluorine atom may include perfluoro tert-buthyl peroxide, perfluoro benzoyl peroxide, and the like. Such photopolymerization initiators known in the art may be used solely, or two or more photopolymerization initiators may be combinedly used.

The photopolymerizable mixture may contain a photosensitizer. For example, the photosensitizer may include amines such as n-buthylamine, di-n-buthylamine, tri-n-buthyl phosphine, allylthiourea, s-benzyl isothiouuronium-p-toluene sulfonate, triethylamine, diethylamino ethylmethacrylate, triethylenetetramin, 4,4'-bis(dialkylamino)benzophenone, (N,N-dimethylamino)benzoic acid ethyl ester, (N,N-diethylamino)benzoic acid isoamyl ester, penthyl-4-dimethylaminobenzoate, and triethylamine, triethanolamine. Such photosensitizers known in the art may be used solely, or two or more photosensitizers may be combinedly used.

The following initiators are commercially available: "IRGACURE (registered trademark)" produced by BASF Co., Ltd. (such as IRGACURE651, 184, 500, 2959, 127, 754, 907, 369, 379, 379EG, 819, 1800, 784, OXE01, and OXE02), "DAROCURE (registered trademark)" (such as DAROCURE1173, MBF, TPO, and 4265), and the like.

The photopolymerization initiators may be used solely, or two or more photopolymerization initiators may be mixedly used. If two or more photopolymerization initiators are mixedly used, they may be selected from the viewpoint of dispersibility of fluorine-containing (meth)acrylate and curability of the surface and the inner side of the fine convex-concave structure of the photopolymerizable mixture. For example, an α-hydroxyketone-based photopolymerization initiator and α-aminoketone-based photopolymerization initiator may be mixedly used. In a case where two or more photopolymerization initiators are mixedly used, a combination of two or more photopolymerization initiators may include a combination of IRGACURE and IRGACURE or a combination or IRGACURE and DAROCURE, such as a combination of DAROCURE1173 and IRGACURE819, a combination of IRGACURE379 and IRGACURE 127, a combination of IRGACURE819 and IRGACURE127, a combination of IRGACURE250 and IRGACURE127, a combination of IRGACURE184 and IRGACURE369, a combination of IRGACURE184 and IRGACURE379EG, a combination of IRGACURE184 and IRGACURE907, a combination of IRGACURE127 and IRGACURE379EG, a combination of IRGACURE819 and IRGACURE184, and a combination of DAROCURE TPO and IRGACURE184.

Hereinbefore, each component used to manufacture the layered products for metamaterial transfer 1 and 2 according to an embodiment of the invention has been described in detail.

Next, description will be made for a method of manufacturing the layered products for metamaterial transfer 1 and 2 according to an embodiment of the invention using each component described above.

The layered product for metamaterial transfer 1 illustrated in FIG. 1 can be manufactured by sequentially performing the following processes (1) to (6) described below. FIGS. 3A to 3F are explanatory diagrams illustrating processes for manufacturing the layered product for metamaterial transfer 1.

The following processes are preferably performed in a roll-to-roll manner.

Figure 3A:
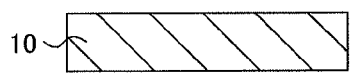
FIGS. 3A to 3F are explanatory diagrams illustrating an exemplary process of manufacturing a layered product for metamaterial transfer according to the present embodiment of the invention.
Figure 3B:
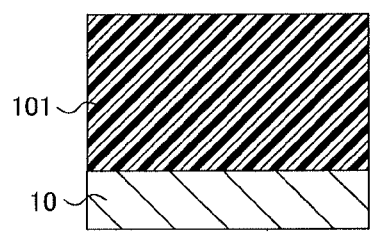

Process (1): coat the curable resin composition 101 on the support substrate 10 illustrated in FIG. 3A (resin coating process, refer to FIG. 3B).

Figure 3C:
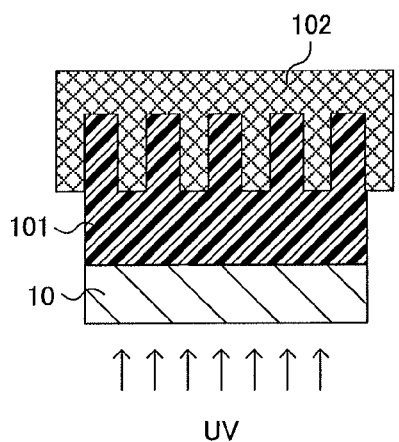

Process (2): press the coated curable resin composition 101 into the master mold 102 subjected to the releasing treatment (process of pressing resin into a die, refer to FIG. 3C).

Process (3): irradiate light from the support substrate 10 side to perform radical photopolymerization for the curable resin composition 101 and obtain a cured material (resin photocuring process, refer to FIG. 3C).

Figure 3D:
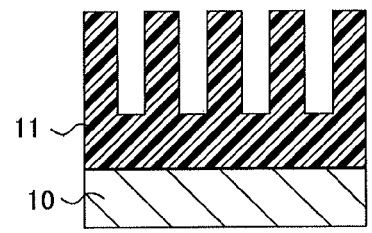

Process (4): release the cured material from the master mold 102 to obtain the resin mold 11 having a shape reversed to the pattern shape of the master mold 102 (process of releasing the cured material from the mold, process of obtaining the resin mold A, refer to FIG. 3D).

Figure 3E:
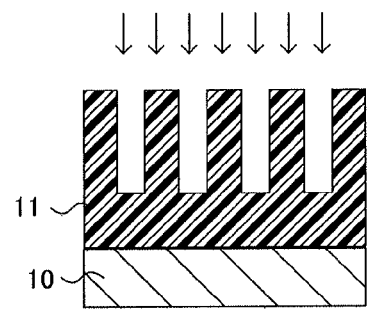

Process (5): form the inorganic layer 12 on the fine convex-concave structure of the resin mold 11 through a vacuum process (refer to FIG. 3E).

Figure 3F:
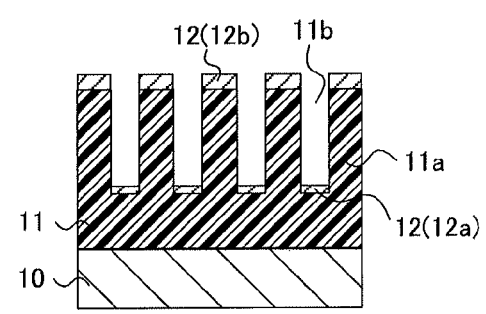

Process (6): obtain the inorganic layer 12 having a layered structure consisting of <at least one metal layer/at least one dielectric layer/at least one metal layer> (refer to FIG. 3F).

In addition, the resin mold B may be manufactured by using the resin mold A obtained in the process (4) as a mold as illustrated in FIGS. 4A to 4D, and the processes subsequent to the process (5) may be performed using the resin mold B.

Figure 4A:
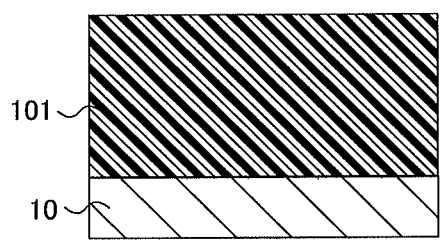
FIGS. 4A to 4D are explanatory diagrams illustrating an exemplary process of manufacturing a layered product for metamaterial transfer according to the present embodiment of the invention.

Process (4-1): coat the curable resin composition 101 on the support substrate 10 (resin coating process, refer to FIG. 4A).

Figure 4B:
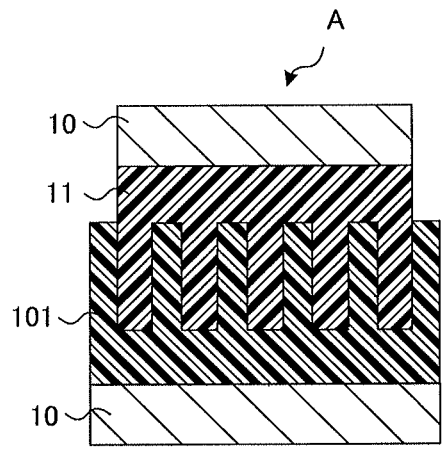

Process (4-2): press the coated curable resin composition 101 into the resin mold A (process of pressing resin into the mold, refer to FIG. 4B).

Figure 4C:
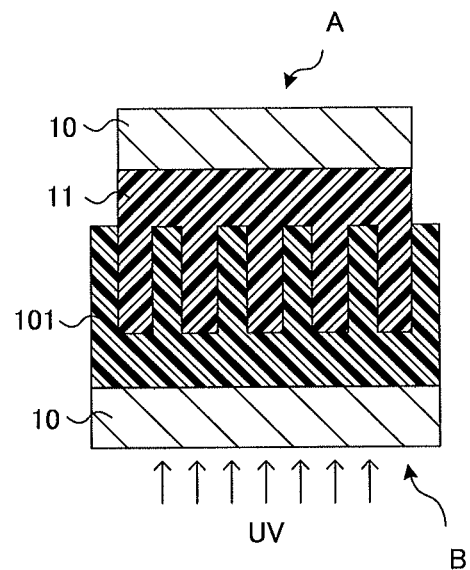

Process (4-3): irradiate light from both or any one of the support substrate 10 side of the resin mold A and the support substrate 10 side of the resin mold B to perform radical photopolymerization of the curable resin composition 101 and obtain the cured material (resin photocuring process, refer to FIG. 4C).

Figure 4D:
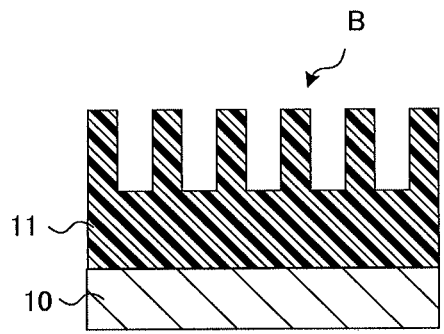

Process (4-4): release the cured material from the resin mold A to obtain the resin mold 11 having the same shape as the pattern shape of the master mold 102 (process of releasing the mold from the cured material, process of obtaining the resin mold B, refer to FIG. 4D).

A coating method in the process (1) may include roller coating, bar coating, mold coating, spray coating, air knife coating, flow coating, curtain coating, and the like.

It is preferable that the deposition in the vacuum process in the process (5) be consecutive deposition. Particularly, consecutive deposition is preferable from the viewpoint of the transfer precision of the inorganic layer 12b.

The releasing layer may be provided on the resin mold 11 before the process (5). The releasing layer preferably has a thickness of 5 nm or greater in order to improve the transfer precision of the inorganic layer 12.

A process of putting (matching) and winding a cover film may be added after the process (6).

Figure 5:
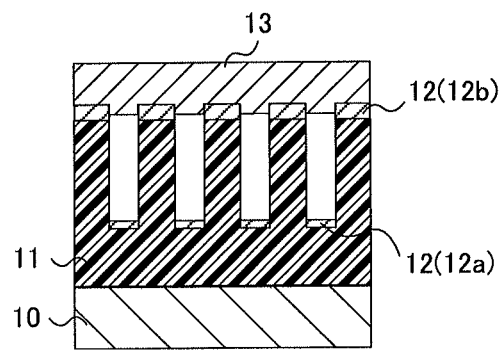
FIG. 5 is an explanatory diagram illustrating an exemplary process of manufacturing a layered product for metamaterial transfer according to the present embodiment of the invention.

Subsequently, a method of manufacturing the layered product for metamaterial transfer 2 having the adhesive layer illustrated in FIG. 2 will be described. FIG. 5 is an explanatory diagram illustrating a process of manufacturing the layered product for metamaterial transfer 2. The layered product for metamaterial transfer 2 can be manufactured by performing the process (7) subsequent to the processes (1) to (6) described above. In addition, the following process is preferably performed in a roll-to-roll manner.

Process (7): coat the adhesive layer 13 on the inorganic layer 12 having a layered structure consisting of <at least one metal layer/at least one dielectric layer/at least one metal layer> formed on the resin mold 11 (refer to FIG. 5).

The coating method of the process (7) may include roller coating, bar coating, mold coating, spray coating, air knife coating, flow coating, curtain coating, casting, and the like. In addition, a material of the adhesive layer 13 may be diluted using a solvent, and then a drying process may be performed. In addition, a process of putting (matching) and winding the cover film may be added after the process (7).

In addition, a releasing agent may be filled in the concave portion before the process (7). The releasing agent may be filled by employing the same technique as that of the method of coating the adhesive layer 13 in the process (7). Alternatively, a method of exposing the layered product including the resin mold 11 and the inorganic layer 12 under a releasing agent vapor may be employed. Through this process, it is possible to improve the transfer precision of the inorganic layer 12b.

In the layered product for metamaterial transfer 2, the adhesive layer 13 may be filled in the entire concave portion, or a cavity may be formed on the inorganic layer 12a. It is preferable that the cavity is formed on the inorganic layer 12a from the viewpoint of the transfer capability of the inorganic layer 12b. In addition, it is preferable that the intrusion thickness of the adhesive layer 13 from the top position Scv of the inorganic layer 12b be smaller than the distance lcv. If this relationship is satisfied, it is possible to more improve the transfer precision of the inorganic layer 12b while a function of the transferred metamaterial is maintained. In addition, if the intrusion thickness of the adhesive layer 13 is larger than the distance lcv, the adhesive layer 13 remaining after the transfer can be removed through ashing.

Subsequently, a method of using the layered products for metamaterial transfer 1 and 2 will be described.

Figure 6A:
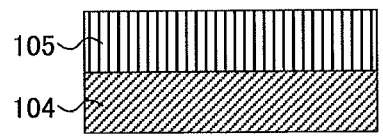
FIGS. 6A to 6C are explanatory diagrams illustrating an exemplary method of forming a metamaterial on a substrate using a layered product for metamaterial transfer according to the present embodiment of the invention.
Figure 6B:
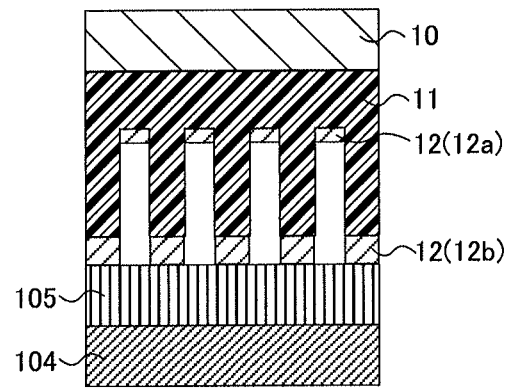
Figure 6C:
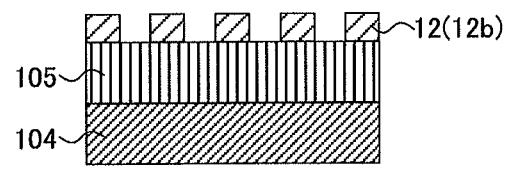

It is possible to manufacture the metamaterial layer on the target substrate 104 using the layered product for metamaterial transfer 1 by sequentially performing the following processes (11) to (14). FIGS. 6A to 6C are explanatory diagrams illustrating a method of forming a metamaterial on the substrate 104 using the layered product for metamaterial transfer 1.

Process (11): form an adhesive layer 105 on a substrate 104 (refer to FIG. 6A).

Process (12): laminate the adhesive layer 105 to the inorganic layer 12 face side of the layered product for metamaterial transfer (refer to FIG. 6B).

Process (13): release the resin mold 11 and the support substrate 10 of the layered product for metamaterial transfer (refer to FIG. 6C).

In addition, the adhesive layer 105 may be formed using the same material as that of the adhesive layer 13 of the layered product for metamaterial transfer 2.

In addition, if the adhesive layer 105 is made of thermoplastic resin in the process (12), a heating process is preferably included in the laminating. Otherwise, if the adhesive layer 105 is made of photocurable resin, a light irradiation process is preferably included in the laminating.

In the layered product consisting of <the layered product for metamaterial transfer/the adhesive layer 105/the substrate 104> manufactured through the process (12), it is preferable that a cavity be provided between the adhesive layer 105 and the inorganic layer 12a formed inside the fine convex-concave structure. In addition, it is preferable that the intrusion thickness (not illustrated in FIG. 6B) of the adhesive layer 105 from the top position Scv of the inorganic layer 12b be smaller than the distance lcv. If this relationship is satisfied, it is possible to more improve the transfer precision of the inorganic layer 12b while a function of the transferred metamaterial is maintained. Furthermore, if the intrusion thickness of the adhesive layer 105 is larger than the distance lcv, the adhesive layer 105 remaining after the transfer can be removed through ashing.

Although the adhesive layer 105 is formed on the substrate 104 in the process (11) as illustrated in FIG. 6A, the substrate and the adhesive layer may be integrated into a single body. For example, an adhesive tape or PDMS known in the art and commercially available may be used.

Figure 7A:
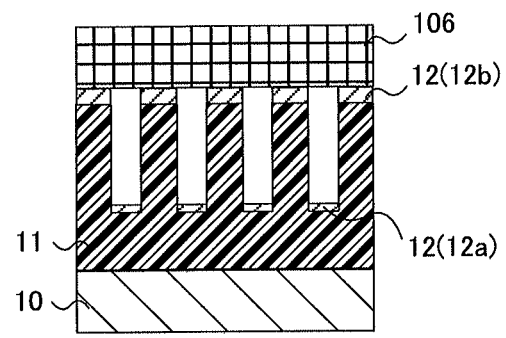
FIGS. 7A and 7B are explanatory diagrams illustrating an exemplary method of forming a metamaterial on a substrate using a layered product for metamaterial transfer according to the present embodiment of the invention.
Figure 7B:
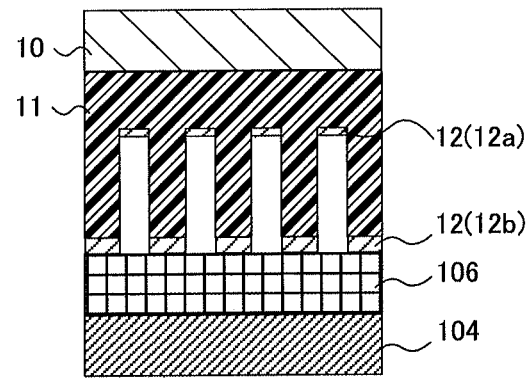

Also, the metamaterial layer can be manufactured on the target substrate 104 using the layered product for metamaterial transfer 1 through the following processes (15) to (16). FIGS. 7A and 7B are explanatory diagrams illustrating formation of the metamaterial on the substrate 104 using the layered product for metamaterial transfer.

Process (15): coat the adhesive layer 106 on the inorganic layer 12 of the layered product for metamaterial transfer (refer to FIG. 7A).

Process (16): stack the adhesive layer 106 and the substrate 104 (refer to FIG. 7B).

The processes subsequent to the aforementioned process (12) may be sequentially performed after the process (16).

The adhesive layer 106 may be made of the same material as that of the adhesive layer 13 of the layered product for metamaterial transfer 2 having the adhesive layer.

Figure 8A:
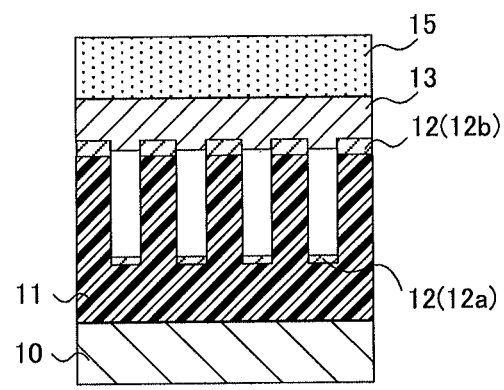
FIGS. 8A and 8B are explanatory diagrams illustrating an exemplary method of forming a metamaterial on a substrate using a layered product for metamaterial transfer according to the present embodiment of the invention.

The metamaterial layer may be manufactured on the target substrate 104 using the layered product for metamaterial transfer 2 having the adhesive layer through the following process (17). FIG. 8 is an explanatory diagram illustrating a process of forming the metamaterial on the substrate 104 using the layered product for metamaterial transfer 2 having the adhesive layer.

Figure 8B:
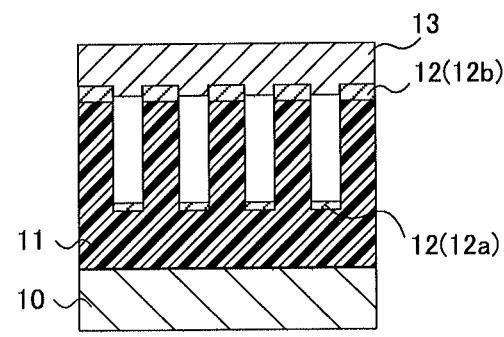

Process (17): remove the cover film 15 from the layered product (refer to FIG. 8A) consisting of <the cover film 15/the adhesive layer 13/the inorganic layer 12/the resin mold 11> (refer to FIG. 8B).

The processes subsequent to the aforementioned process (15) may be performed after the process (17).

It is possible to easily form the inorganic layer 12b having a layered structure consisting of <at least one metal layer/least one dielectric layer/at least one metal layer> serving as a large-scaled metamaterial by using the layered product for metamaterial transfer according to an embodiment of the invention as described above. As a result, it is possible to easily form the metamaterial layer on the target substrate surface and obtain a large area.

EXAMPLES

Example 1

(a) Cylindrical Mold Manufacturing (Manufacturing of a Mold for Fabricating a Resin Mold)

Quartz glass was used as a substrate of a cylindrical mold, and a fine convex-concave structure was formed on the surface of the quartz glass through semiconductor laser direct write lithography. DURASURF HD-1101Z (produced by DAIKIN CHENICAL INDUSTRIES Co., Ltd.) was coated on the surface of the quartz glass roll having the fine surface convex-concave portion and was heated at a temperature of 60° C. for one hour. Then, they were left at a room temperature for 24 hours for solidification of DURASURF HD-1101Z. Then, the cleaning was performed three times using DURASURF HD-ZV (produced by DAIKIN CHENICAL INDUSTRIES Co., Ltd.), and the mold release treatment was performed.

(b) Resin Mold Manufacturing

A photocurable resin liquid was prepared by mixing source materials corresponding to the sample numbers of Table 1 described below. As the fluorine-containing (meth)acrylate, OPTOOL (registered trademark) DAC HP (produced by DAIKIN INDUSTRIES, Co., Ltd.) was used for the samples D1 to D7 in the Table 1 described below. In addition, CHEMINOX FAMAC-6 (produced by UNIMATEC Co., Ltd.) was used for the samples F1 to F4. In the process of manufacturing the resin mold B from the resin mold A, the resin mold B was manufactured using the same resin as that used in the process of manufacturing the resin mold A.

The photocurable resin was coated on the easy adhesion surface of a PET film (such as A4100 produced by TOYOBO Co., Ltd.) having a width of 300 mm and a thickness of 100 µm using MICROGRAVURE COATING (produced by YASUI SEIKI Co., Ltd.) with the coat thickness of 6 µm. Then, the PET film having the photocurable resin coat was pressedly attached to the cylindrical mold using a nip roll (0.1 MPa), and ultraviolet rays were irradiated using a UV exposure apparatus (H-bulb) (produced by FUSION UV SYSTEMS JAPAN Co., Ltd.) in the atmosphere, at a temperature of 25° C. and a humidity of 60% with an integrated exposure amount of 600 mJ/cm$^2$ under the center of the lamp. A reel-shaped resin mold A (having a length of 200 m and a width of 300 mm) having the fine convex-concave structure transferred onto the surface was obtained by consecutively performing photocuring. The shape of the fine convex-concave structure of the surface of the reel-shaped resin mold A was observed using a scanning electron microscope. As a result, the neighboring distance between convex portions was 460 nm, and the height of the convex portion was 500 nm.

The same photocurable resin as that used to manufacture the resin mold A was coated on the easy adhesion surface of a PET film (such as A4100 produced by TOYOBO Co., Ltd.) having a width of 300 mm and a thickness of 100 µm using MICROGRAVURE COATING (produced by YASUI SEIKI Co., Ltd.) with the coat thickness of 6 µm. Then, the PET film having the photocurable resin coat was pressedly attached to the surface of the fine convex-concave structure of the resin mold A obtained by directly transferring from the cylindrical mold using a nip roll (0.1 MPa), and ultraviolet rays were irradiated using a UV exposure apparatus (H-bulb) (produced by FUSION UV SYSTEMS JAPAN Co., Ltd.) in the atmosphere at a temperature of 25° C. and a humidity of 60% with an integrated exposure amount of 600 mJ/cm$^2$ under the center of the lamp. A plurality of reel-shaped resin molds B (having a length of 200 m and a width of 300 mm) having the fine convex-concave structure which is similar to that of the cylindrical mold and is transferred onto the surface were obtained by consecutively performing photocuring. The shape of the fine convex-concave structure of the surface of the reel-shaped resin mold B was observed using a scanning electron microscope. As a result, the opening width of the concave portion was φ230 nm, the neighboring distance between concave portions was 460 nm, and the height of the concave portion was 500 nm.

The ratio $Es/Eb$ between the surface elemental fluorine concentration $Es$ and the average elemental fluorine concentration $Eb$ of the resulting resin mold B can be adjusted between 19 and 160 by using the photocurable resin of D1 to D7 as indicated in Table 1 described below depending on the preparation amount of the DACHP. In addition, the ratio $Es/Eb$ can be adjusted between 5.0 and 42 by using the photocurable resin of F1 to F4 as indicated in Table 1 described below depending on the preparation amount of FAMAC-6.

The resin mold B having the fine convex-concave structure having a line-and-space shape on the surface was also manufactured using the aforementioned technique. The surface fine convex-concave structure of the resulting resin mold has a pitch of 130 nm and a height of 150 nm. The ratio $Es/Eb$ between the surface elemental fluorine concentration $Es$ and the average elemental fluorine concentration $Eb$ of the resulting resin mold L/S can be adjusted between 40 and 90 depending on the preparation amount of DACHP.

The following operation was performed for the resin mold B having a hole shape as the fine convex-concave structure and the resin mold B having a line-and-space shape as the fine convex-concave structure. Hereinafter, the resin mold will be denoted by a resin mold M1 regardless of the type of the fine convex-concave structure.

A silver layer having a thickness of 30 nm was deposited on the resin mold M1 through vacuum deposition under a layer formation pressure of $4.0 \times 10^{-4}$ MPa. Then, a magnesium fluoride layer having a thickness of 50 nm was deposited. Then, a silver layer having a thickness of 30 nm was deposited, so that a layered product for metamaterial transfer S1 was manufactured. That is, the layered product for metamaterial transfer S1 was manufactured such that a distance lcv between the top position S of he convex portion of the convex-concave structure and the top position Scv of the inorganic layer deposited over the convex portion of the convex-concave structure satisfies a relationship $0 < lcv \le 1.0 ho$, where ho denotes a depth of the convex-concave structure.

Then, an adhesive layer was coated on a PET film (A4300 produced by TOYOBO Co., Ltd) having a width of 300 mm and a thickness of 250 µm by coating a 2.0 wt % acrylate solution using a spin coater to prepare the substrate B1. The adhesive layer has a dry thickness of 100 nm. The acrylate solution contains pentaerythritol triacrylate (PE3A produced by KYOEISHA CHEMICAL Co., Ltd.) of 1.0 parts by weight, dipentaerythritol hexacrylate (ADPH produced by SHIN-NAKAMURA CHEMICAL Co., Ltd.) of 1.0 parts by weight, methyl isobutyl ketone of 98 parts by weight, and IRGACURE-184 produced by BASF Co., Ltd. of 0.050 parts by weight.

Then, after the substrates S1 and B1 were laminated, photocuring was performed by irradiating ultraviolet rays using a UV exposure apparatus (H-bulb) produced by FUSION UV SYSTEMS JAPAN Co., Ltd up to an integrated exposure amount of 700 mJ/cm$^2$.

Then, the resin mold M1 was released, and it was observed that the inorganic layer is transferred onto the PET film by interposing the adhesive layer. Only the inorganic layer (inorganic layer 12b) deposited on the convex portion of the resin mold was the transferred inorganic layer. The result of transfer capability evaluation is indicated in the row of the transfer capability evaluation of Table 1 described below.

Example 2

A releasing layer made of Alq3 having a thickness of 50 nm was deposited on the resin mold M1 manufactured in Example 1 through vacuum deposition under a deposition pressure of $4.0 \times 10^{-4}$ MPa. Then, a silver layer having a thickness of 30 nm, a magnesium fluoride layer having a thickness of 50 nm, and a silver layer having a thickness of 30 nm were deposited so that a layered product for metamaterial transfer S2 was manufactured.

Then, after the layered product for metamaterial transfer S2 was bonded to the substrate B1 manufactured in Example 1, photocuring was performed by irradiating ultraviolet rays using a UV exposure apparatus (H-bulb) produced by Fusion UV Systems Japan Co., Ltd. up to an integrated exposure amount of 700 mJ/cm².

Then, the resin mold M1 was released, and it was observed that the inorganic layer is transferred onto the PET film by interposing the adhesive layer. Only the inorganic layer (inorganic layer 12b) deposited in the convex portion of the resin mold was the transferred inorganic layer.

Example 3

An Ag—Pd alloy (APC-TR produced by FURUYA METAL Co., Ltd.) layer having a thickness of 30 nm was deposited on the resin mold M1 manufactured in Example 1 using a magnetron sputter under an argon (Ar) atmosphere of $5.0 \times 10^{-1}$ MPa. Then, a magnesium fluoride layer having a thickness of 50 nm and an Ag—Pd alloy layer having a thickness of 30 nm were deposited, so that a layered product for metamaterial transfer S3 was manufactured.

Then, after the layered product for metamaterial transfer S3 was laminated to the substrate B1 manufactured in Example 1, photocuring was performed by irradiating ultraviolet rays using a UV exposure apparatus (H-bulb) produced by Fusion UV Systems Japan Co., Ltd. up to an integrated exposure amount of 700 mJ/cm².

Then, the resin mold M1 was released, and it was observed that the inorganic layer is transferred onto the PET film by interposing the adhesive layer. Only the inorganic layer (inorganic layer 12b) deposited in the convex portion of the resin mold was the transferred inorganic layer.

Example 4

A releasing layer made of Alq3 having a thickness of 50 nm was deposited on the resin mold M1 manufactured in Example 1 through vacuum deposition under a deposition pressure of $4.0 \times 10^{-4}$ MPa. Then, an Ag—Pd alloy (APC-TR produced by FURUYA METAL Co., Ltd.) layer having a thickness of 30 nm was deposited using a magnetron sputter under an argon (Ar) atmosphere of $5.0 \times 10^{-1}$ MPa. Then, a magnesium fluoride layer having a thickness of 50 nm and an Ag—Pd alloy layer having a thickness of 30 nm were deposited, so that a layered product for metamaterial transfer S2 was manufactured.

Then, after the layered product for metamaterial transfer S2 was laminated to the substrate B1, photocuring was performed by irradiating ultraviolet rays using a UV exposure apparatus (H-bulb) produced by Fusion UV Systems Japan Co., Ltd. up to an integrated exposure amount of 700 mJ/cm².

Then, the resin mold M1 was released, and it was observed that the inorganic layer is transferred onto the PET film by interposing the adhesive layer. Only the inorganic layer (inorganic layer 12b) deposited in the convex portion of the resin mold was the transferred inorganic layer.

Comparative Example 1

The same operation as that of Example 1 was performed to manufacture the resin mold M1' and the layered product for metamaterial transfer S1' except for a fact that the samples D8 to D10 and KK were used as a photocurable resin in Table 1 described below. Then, similar to Example 1, the layered product for metamaterial transfer S1' and the substrate B1 were laminated, UV-irradiation was performed, and then, the resin mold MP was released. However, it was not possible to transfer the inorganic layer by interposing the adhesive layer on the PET film. The result of the transfer capability evaluation is indicated in the row of the transfer capability evaluation of Table 1 described below. The sample KK was synthesized as follows. A prepolymer diluted with a methyl ethyl ketone solution was obtained by mixing trifluoroethyl methacrylate (45 parts by weight), perfluorooctylethyl acrylate (45 parts by weight), glycidyl methacrylate (10 parts by weight), dodecyl mercaptan (0.5 parts by weight), 2-2'-azobis(2-methylbutyronitrile) (1.5 parts by weight), and methyl ethyl ketone (200 parts by weight) and stirring the mixture under a nitrogen atmosphere at a temperature of 80° C. for 7 hours. Then, the sample KK was obtained by mixing the methylethyl ketone solution of the prepolymer (26 parts by weight), FLUORITE FE-16 (4 parts by weight), and SAN-AID SI-100L produced by SANSHIN CHEMICAL INDUSTRY Co., Ltd. (0.2 parts by weight) and diluting the mixture with methylethyl ketone. The sample KK contained 10% solid content.

TABLE 1

| photocurable resin | | D1 | D2 | D3 | D4 | D5 | D6 | D7 | D8 |
|---|---|---|---|---|---|---|---|---|---|
| PTOOL DAC HP (parts by weight) | | 5.00 | 10.0 | 17.5 | 20.0 | 25.0 | 30.0 | 40.0 | 0.100 |
| FAMAC-6 (parts by weight) | | — | — | — | — | — | — | — | — |
| non-fluorine-containing (meth)acrylate (parts by weight) | | 100 | 100 | 100 | 100 | 100 | 100 | 100 | 100 |
| photopolymerization initiator (parts by weight) | IRGACURE 184 | 5.00 | 5.00 | 5.50 | 5.50 | 5.50 | 5.50 | 5.50 | 5.00 |
| | IRGACURE 369 | 0.00 | 0.00 | 2.00 | 2.00 | 2.00 | 2.00 | 2.00 | 0.00 |
| fluorin-containing (meth)acrylate (parts by weight) | | 1.0 | 2.0 | 3.4 | 4.0 | 5.0 | 6.0 | 8.0 | 0.025 |

TABLE 1-continued

| | | | | | | | | |
|---|---|---|---|---|---|---|---|---|
| Es/Eb | 160 | 64 | 40 | 34 | 29 | 25 | 19 | 3300 |
| transfer capability evaluation | A | A | A | A | A | A | A | C |

| | photocurable resin | D9 | D10 | F1 | F2 | F3 | F4 | KK |
|---|---|---|---|---|---|---|---|---|
| PTOOL DAC HP (parts by weight) | | 1.00 | 2.00 | — | — | — | — | — |
| FAMAC-6 (parts by weight) | | — | — | 1.00 | 2.00 | 4.00 | 10.0 | — |
| non-fluorine-containing (meth)acrylate (parts by weight) | | 100 | 100 | 100 | 100 | 100 | 100 | — |
| photopolymerization initiator (parts by weight) | IRGACURE 184 | 5.00 | 5.00 | 5.00 | 5.00 | 5.00 | 5.00 | — |
| | IRGACURE 369 | 0.00 | 0.00 | 0.00 | 0.00 | 0.00 | 0.00 | — |
| fluorin-containing (meth)acrylate (parts by weight) | | 0.25 | 0.4 | 1.0 | 2.0 | 4.0 | 10 | 900 |
| Es/Eb | | 480 | 270 | 42 | 16 | 10 | 5.0 | 1.0 |
| transfer capability evaluation | | C | B | A | A | A | A | C |

Elemental Fluorine Concentration Measurement

The surface elemental fluorine concentration of the resin mold was measured through X-ray photoelectron spectroscopy (hereinafter, referred to as XPS). Since the X-ray penetration depth on the sample surface in XPS is very shallow such as several nanometers, the XPS measurement value was employed as the elemental fluorine concentration Es of the resin mold surface in the present invention. The resin mold was cut into a small piece having a length of, approximately, 2 mm, across all directions and a slot-type mask of 1 mm by 2 mm was put thereon, so that the resin mold piece was used in the XPS measurement.

XPS Measurement Condition

Measurement Device: Thermo Fisher Scientific K. K. ESCALAB250

Excitation Source: mono. AlKα (15 kV×10 mA)

Analysis Size: approximately 1 mm (oval shape)

Scan Area

Survey Scan: 0 to 1,100 eV

Narrow Scan: F 1 s, C 1 s, O 1 s, N 1 s

Pass Energy

Survey Scan: 100 eV

Narrow Scan: 20 eV

Meanwhile, in order to measure the average elemental fluorine concentration Eb of the resin of the resin mold, a physically exfoliated fragment is decomposed using a flask combustion technique, and subsequently, ion chromatography analysis was performed.

Transfer Capability Evaluation

The transfer capability evaluation shows a result of the inorganic layer transfer when the layered product for metamaterial transfer and the substrate are laminated, photocuring is performed, and then, the resin mold is released. In Table 1, the reference symbol A denotes a case where the inorganic layer is entirely transferred onto the PET film by interposing the adhesive layer. The reference symbol B denotes a case where the inorganic layer is partially transferred onto the PET film by interposing the adhesive layer. The reference symbol C denotes a case where the inorganic layer is not transferred onto the PET film by interposing the adhesive layer.

The present invention may be variously changed or modified without limiting to the embodiments described above. In the aforementioned embodiments, the sizes or shapes of elements illustrated in the accompanying drawings may be appropriately changed or modified without limitation. Other changes, alterations, or modifications can be appropriately made without departing from the scope or spirit of the present invention.

According to the present invention, it is possible to easily form a large-area metamaterial layer on a substrate. The present invention may be applied to, for example, manufacturing of a perfect lens, a super lens, cloaking, an MRI electromagnetic wire, a perfect absorber, and the like.

This application is based on and claims priority to Japanese Unexamined Patent Application Nos. 2011-199503 and 2011-274103, filed on Sep. 13, 2011, and Dec. 15, 2011, respectively, the entire content of which is incorporated herein by reference.

What is claimed is:

1. A layered product for metamaterial transfer for transferring a metamaterial layer onto a substrate, comprising:

a resin mold having a fine convex-concave structure on a surface; and a metamaterial layer deposited on the surface of the resin mold, wherein metamaterial layer has a layered structure, which includes at least one dielectric layer and at least one metal layer wherein resin of the resin mold contains fluorine, and a ratio between an average elemental fluorine concentration Eb of the resin and an elemental fluorine concentration Es of the surface of the resin mold satisfies the following equation (1):

$$200 \geq (Es/Eb) \geq 5.0 \tag{1}$$

2. The layered product for metamaterial transfer according to claim 1, wherein the metamaterial layer consisting of <at least the one metal layer/at least the one dielectric layer/at least the one metal layer>.

3. The layered product for metamaterial transfer according to claim 1, wherein the metamaterial layer has an alternating multilayer structure having a plurality of layered structures including the metal layers and the dielectric layers.

4. The layered product for metamaterial transfer according to claim 1, wherein the resin includes copolymer containing fluorine-containing (meth)acrylate and non-fluorine-containing (meth)acrylate, and a composition of the fluorine-containing (meth)acrylate is expressed as chemical formulas (1) or (4) as follows:

[Chemical Formula 1]

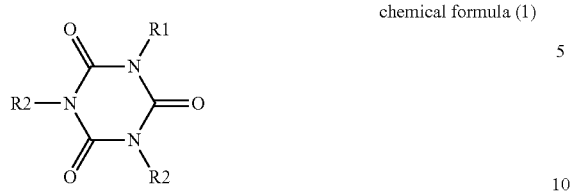

chemical formula (1)

where R1 denotes the following chemical formula (2), and R2 denotes the following chemical formula (3);

[Chemical Formula 2]

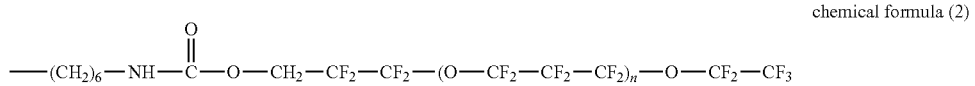

chemical formula (2)

where n denotes an integer equal to or greater than 1 and equal to or smaller than 6;

[Chemical Formula 3]

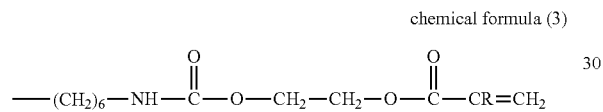

chemical formula (3)

where R denotes hydrogen (H) or $CH_3$; and

[Chemical Formula 4]

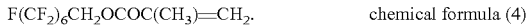    chemical formula (4)

5. The layered product for metamaterial transfer according to claim 1, wherein an aspect ratio of the convex-concave structure is equal to or greater than 0.5 and equal to or smaller than 3.

6. The layered product for metamaterial transfer according to claim 1, wherein a distance between neighboring convex portions of the convex-concave structure is equal to or greater than 50 nm and equal to or smaller than 1000 nm.

7. A metamaterial transferred substrate which is obtained by transferring the metamaterial layer onto a substrate from the layered product for metamaterial transfer according to claim 1.

* * * * *